(12) United States Patent
Reker

(10) Patent No.: US 7,230,820 B2
(45) Date of Patent: Jun. 12, 2007

(54) DISTRIBUTOR MEANS FOR CONNECTING ELECTRICAL APPARATUS WITH A PLURALITY OF VOLTAGE SOURCES

(75) Inventor: Stefan Reker, Bielefeld (DE)

(73) Assignee: Weidmüller Interface GmbH & Co.KG, Detmold (DE)

( * ) Notice: Subject to any disclaimer, the term of this patent is extended or adjusted under 35 U.S.C. 154(b) by 317 days.

(21) Appl. No.: 10/962,705

(22) Filed: Oct. 13, 2004

(65) Prior Publication Data

US 2005/0083640 A1    Apr. 21, 2005

(30) Foreign Application Priority Data

Oct. 15, 2003    (DE)    ........................... 203 15 837 U

(51) Int. Cl.
*H02B 1/26* (2006.01)
*H05K 5/02* (2006.01)

(52) U.S. Cl. ........................................ 361/641; 174/50

(58) Field of Classification Search ............... 361/627, 361/622

See application file for complete search history.

(56) References Cited

U.S. PATENT DOCUMENTS

| | | | |
|---|---|---|---|
| 2,625,591 A | * | 1/1953 | George ..................... 361/601 |
| 4,780,714 A | | 10/1988 | Moustakas et al. |
| 5,212,623 A | * | 5/1993 | Wilson et al. ............. 361/625 |
| 5,716,241 A | | 2/1998 | Hennemann et al. |
| 5,784,249 A | * | 7/1998 | Pouliot ..................... 361/622 |
| 5,821,636 A | * | 10/1998 | Baker et al. ................. 307/70 |
| 5,905,630 A | * | 5/1999 | Wetterling ................. 361/625 |
| 6,229,691 B1 | * | 5/2001 | Tanzer et al. ............. 361/622 |
| 2002/0014867 A1 | * | 2/2002 | Callahan ..................... 315/312 |

FOREIGN PATENT DOCUMENTS

| | | |
|---|---|---|
| CH | 586 490 | 3/1977 |
| DE | 298 17 816 U1 | 2/1999 |
| DE | 199 26 095 A1 | 12/2000 |
| DE | 199 22 467 A1 | 3/2001 |
| DE | 101 24 691 A1 | 11/2002 |
| DE | 101 55 189 A1 | 7/2003 |
| EP | 0 551 649 | 7/1993 |
| EP | 0 709 962 A2 | 5/1996 |
| EP | 1 189 386 | 3/2002 |
| EP | 1 258 957 | 11/2002 |
| FR | 2 615 339 | 11/1988 |

OTHER PUBLICATIONS

Xi, Youhao, Jain, Praveen K.: The Point of Use DC/DC Power Distribution: the Architecture and an Implementation. In: Telecommunications Energy Conference, 2000, INTELEC, Sep. 2000, S.498-505.

* cited by examiner

*Primary Examiner*—Greg Thompson
(74) *Attorney, Agent, or Firm*—Lawrence E. Laubscher, Sr.; Lawrence E. Laubscher, Jr.

(57) ABSTRACT

A distributor is provided for selectively connecting with a plurality of voltage sources a plurality of electrical load devices, such as the sensors or actuators of an electrical and mechanical installation. A pair of voltage supply connectors mounted on a housing include first pins that are connected to continuously supply power from a first voltage source to the internal electronics circuitry of the distributor, and second pins that are connected via a jumper switch to selectively connect a second voltage source with the groups of electrical load devices.

3 Claims, 2 Drawing Sheets

US 7,230,820 B2

DISTRIBUTOR MEANS FOR CONNECTING ELECTRICAL APPARATUS WITH A PLURALITY OF VOLTAGE SOURCES

CROSS REFERENCE TO RELATED APPLICATIONS

This is a companion application to the Reker, et al., application Ser. No. 10/962,714 filed Oct. 13, 2004.

BACKGROUND OF THE INVENTION

1. Field of the Invention

A distributor is provided for selectively connecting with a plurality of voltage sources a plurality of electrical devices, such as the sensors and actuators of an electro-mechanical installation. A pair of voltage supply connectors mounted on a housing include first pins that are connected to continuously supply power from a first voltage source to the internal electronic circuitry of the distributor, and second pins that are connected via a jumper switch to selectively connect a second voltage source with the electrical devices. At least one bus connector is also provided on the housing for connector with a high-voltage bus bar supply.

2. Description of the Related Art

Various voltage distribution systems have been proposed in the prior art for supplying power to various types of electrical loads, particularly in the field of automation technology for the replacement of the relatively expensive prior solutions.

There is a need for optimization here, especially with regard to the voltage supply of the distributors and the electrical appliances to be connected to them.

BRIEF SUMMARY OF THE INVENTION

Accordingly, a primary object of the present invention is to provide a distributor arrangement that is operable to continuously supply power from a first voltage source to the internal electronics circuitry of the distributor, and to selectively supply power from a second voltage source to a plurality of electrical loads.

According to a more specific object of the invention, a housing carries first and second supply voltage connectors having first pins that are continuously connected together, a first pin of the first connector being connected with the distributor internal electronics circuitry, and the first pin of the second connector is connected with a first voltage source. A second pin of the first voltage supply connector is connected with the a first group electrical load devices, and the second pin of the second voltage supply connector is connected with a second voltage source, these second pins being connected via a selectively operable jumper or changeover switch. A second group of electrical load devices is connected with the second pin of the second supply voltage connector.

As a result of this measure, it is possible to supply groups of distributors separately and preferably also to switch and/or—when the group formation is not needed—to connect the voltage from a voltage supply connection to a next distributor in order when there is a small power output requirement to supply one group of several distributors only once with the voltage.

It is furthermore practical that a first group of electrical devices is connected in a conducting manner with the first voltage supply connection, and a second group is connected in a conducting manner with the second voltage supply connection. In this way, for example, in case of necessity, individual groups of the connected electrical appliances can be separated from the voltage supply separately from each other also directly by correspondingly provided turn-on/turn-off switches upon a higher-order bus voltage supply in the simplest fashion.

BRIEF DESCRIPTION OF THE DRAWINGS

Other objects and advantages of the invention will become apparent from a study of the following specification when viewed in the light of the accompanying drawings, in which.

DETAILED DESCRIPTION OF THE INVENTION

Figure 1:
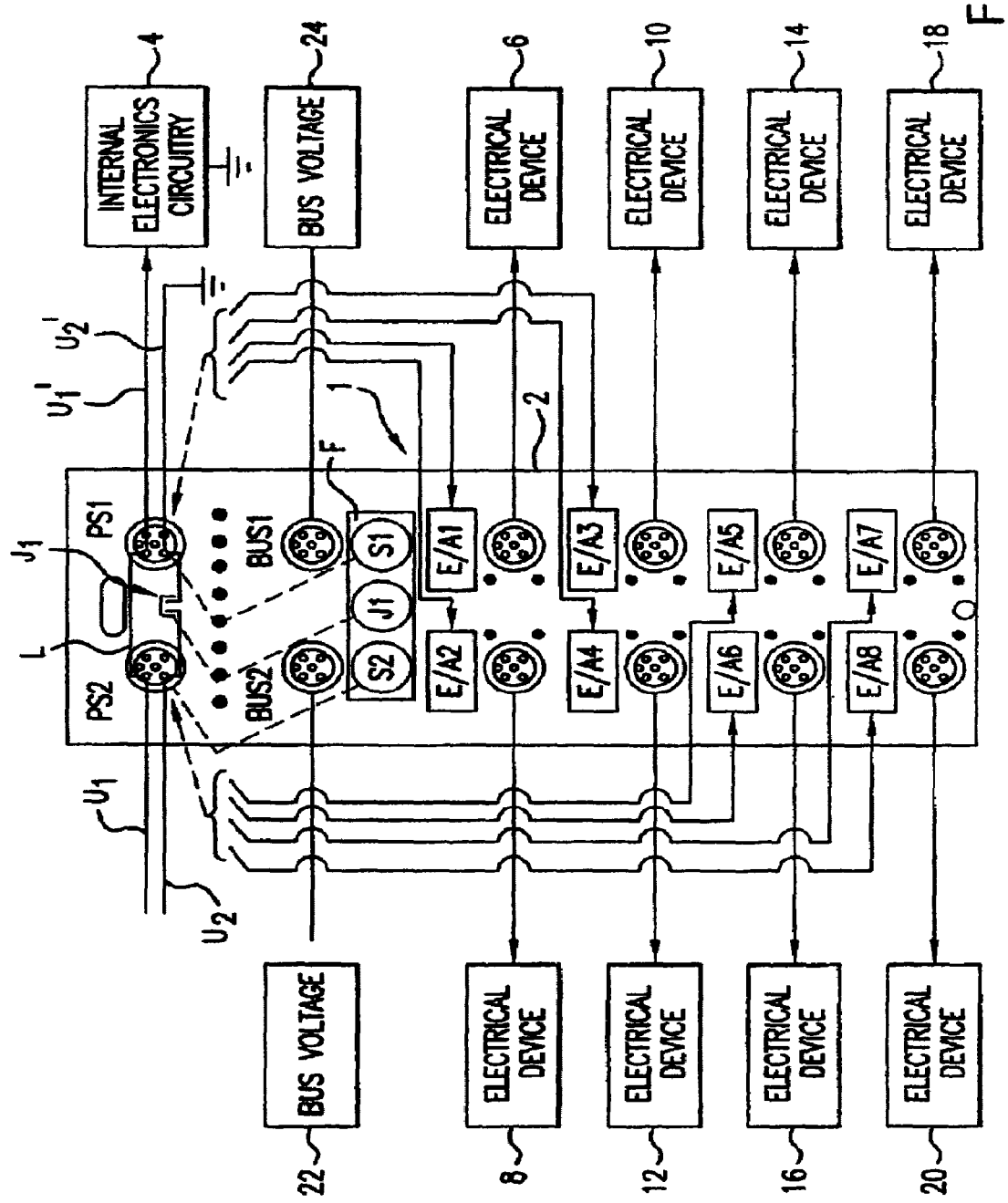
FIG. 1 is a block diagram illustrating the voltage distribution system of the present invention.

Referring first more particularly to FIG. 1, the distributor means 1 of the present invention includes a housing 2 that contains the internal electronics circuitry 4. Mounted on the housing are a plurality of electrical device connections E/A1 to E/A8 connected with the electrical loads 6, 8, 10, 12, 14, 16, and 18, respectively. Also mounted on the housing are a pair of bus connectors BUS1 and BUS2 that are connected with the high-voltage bus supplies 22 and 24, respectively.

Finally, a pair of supply voltage connectors PS1 and PS2 are mounted on the housing for connection with the supply voltage lines $U_1$, and $U_2$. More particularly, the first supply voltage connector PS1 includes a first pin that is connected with the distributor internal electronics circuitry by the line $U_1$, and a plurality of second pins that are selectively connected with a first group of electrical load devices 6, 8, 10, 12 as controlled by an addressing switch S1. Similarly, the second supply voltage connector PS2 includes a first pin connected with the first voltage source $U_1$, and a plurality of second pins that are connected with the second voltage source $U_2$ to supply power to a second group of electrical load devices 14, 16, 18, and 20 as controlled by the second addressing switch S2.

According to an important feature of the invention, the first pins of the first and second supply voltage connectors PS1 and PS2 are continuously connected by the line L, whereby power is continuously supplied from voltage source $U_1$ to the internal electronics circuitry 4. The second pins of the supply voltage connectors PS1 and PS2 are connected via the contacts of a changeover or jumper switch J1.

Using the addressing switches S1 and S2, addresses can be assigned to the first connections E/A1, . . . whereas the changeover switch (Jumper J1), for example, serves for the connection and separation of the supply line connections PS1 and PS2 (for example, in the "M8 Standard" or the like).

The addressing switches and the changeover switches S1, S2, J1 in this case are arranged in an illumination field F made of a transparent material, which, for instance, is illuminated by means of light diodes or the like directly or via inserted light conductors to make it easier to find, thereby assisting in the adjustment and the handling of switches S1, S2 and J1.

The voltage supply connections PS1 and PS2 each have several connecting pins that are partly used for signal transmission and partly for voltage supply.

In operation, by using Jumper J1, one can either connect both groups of the electrical load devices to the voltage source U2, or only the second group E/A5 to E/A8. Supply of voltage to the individual loads of this group is controlled by the addressing switch S2.

Figure 2:
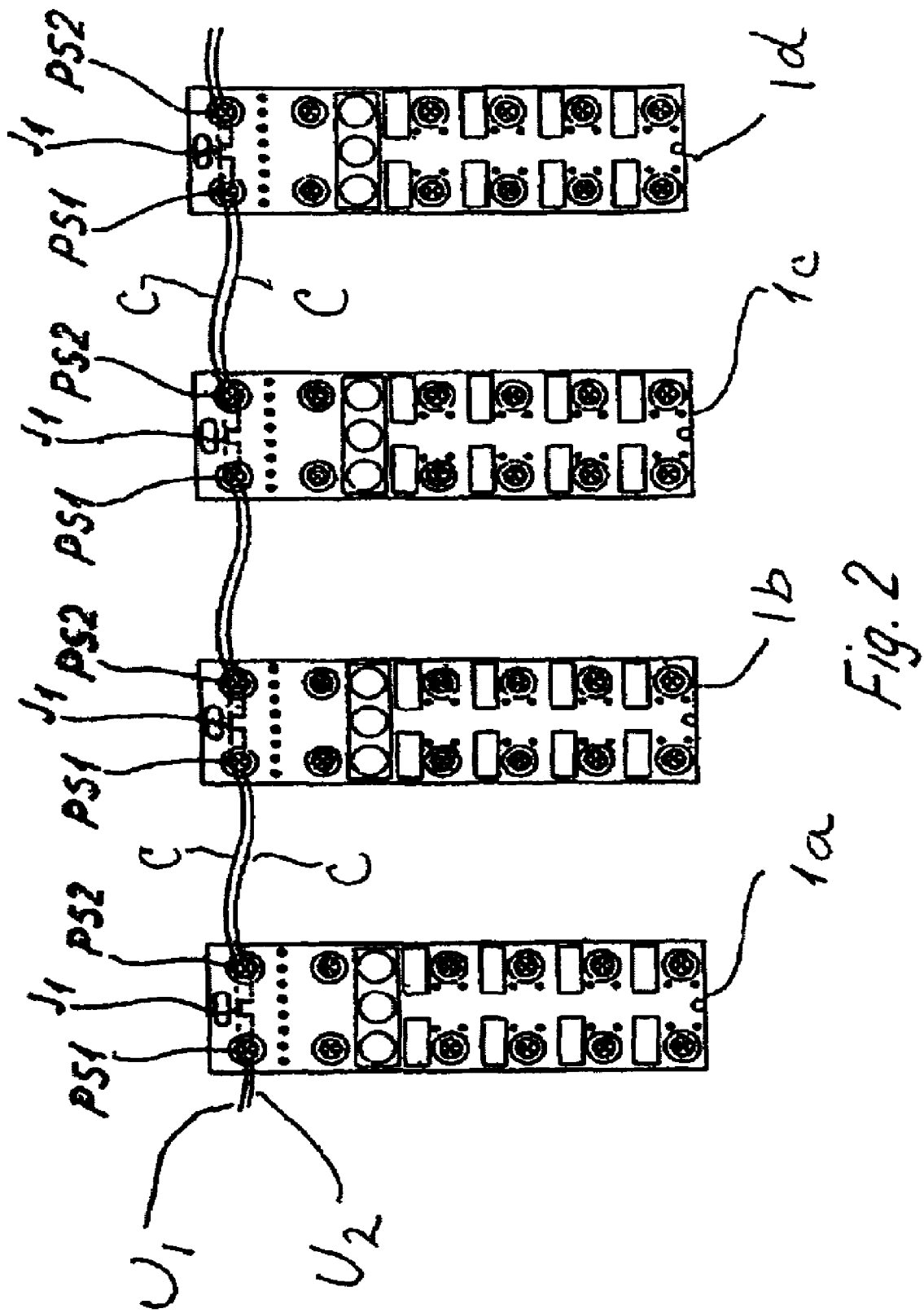
FIG. 2 illustrates the electrical connection of a series of the distributors of FIG. 1.

Moreover, as shown in FIG. 2, it is possible to supply each distributor with a higher output and/or—when group formation is not needed—to supply the voltage from one voltage supply connection with Jumper J1 in a connected condition to a next distributor in order to supply one group of several distributors only once with the voltage in the case of a low power requirement.

It is thus possible in cases where only smaller outputs are required with Jumper J1 set up (which, in these cases, connects the two connecting pins for the connection of voltages U2 with each other) to apply the voltage only upon one connection PS1 or PS2 of a first distributor and to loop the voltage supply otherwise from distributor to distributor (FIG. 2).

While in accordance with the provisions of the Patent Statutes the preferred forms and embodiments of the invention have been illustrated and described, it will be apparent to those skilled in the art that various changes may be made without deviating from the inventive concepts set forth above.

What is claimed is:

1. Distributor means for supplying voltages to a plurality of electrical load devices, such as sensors and actuators, comprising:
   (a) a housing (1) containing internal distributor electronics means (4);
   (b) a plurality of first electrical device connectors (E/A1–E/A4) mounted on said housing for connection with a first group of electrical load devices, respectively;
   (c) at least one bus connector (BUS1, BUS2) mounted on said housing for connection with a bus voltage source;
   (d) a first supply voltage connector (PS1) mounted on said housing and having a plurality of connecting pins, a first one of said connector pins being connected with said distribution electronics means, and a plurality of second pins being connected with said first group of electrical load devices, respectively;
   (e) a second supply voltage connector (PS2) mounted on said housing and having a first pins and a plurality of second pins adapted for connection with first and second supply voltages, respectively, said first pin of said second supply voltage connector being continuously connected with said first pin of said first supply voltage connector; and
   (f) means including jumper switch means (J1) connecting said second pins of said second supply voltage connector with said second pins of said first supply voltage connector, respectively.

2. Distributor means as defined in claim 1, and further including:
   (g) a plurality of second electrical device connectors (E/A5–E/A8) mounted on said housing for connecting a second group of electrical load devices with said second pins of said second supply voltage connector (PS2) respectively.

3. Distributor means as defined in claim 2, and further including:
   (g) a plurality of said distributor means (1a, 1b, 1c, 1d) each having a housing; and
   (h) conductor means (c) connecting the first and second pins of said first supply voltage connectors (PS1) of one distributor means with the first and second pins of said second supply voltage connectors (PS2), respectively, thereby to connect said plurality of distributor means in series.

* * * * *